(12) United States Patent
Sugawara

(10) Patent No.: US 7,013,039 B2
(45) Date of Patent: Mar. 14, 2006

(54) IMAGE PROCESSING METHOD, AN IMAGE PROCESSING DEVICE AND A BONDING APPARATUS

(75) Inventor: Kenji Sugawara, Kokubunji (JP)

(73) Assignee: Kabushiki Kaisha Shinkawa, Tokyo (JP)

(*) Notice: Subject to any disclaimer, the term of this patent is extended or adjusted under 35 U.S.C. 154(b) by 694 days.

(21) Appl. No.: 10/196,879

(22) Filed: Jul. 16, 2002

(65) Prior Publication Data

US 2003/0016860 A1    Jan. 23, 2003

(30) Foreign Application Priority Data

Jul. 18, 2001    (JP) .............................. 2001-218157

(51) Int. Cl.
*G06K 9/62*    (2006.01)

(52) U.S. Cl. ...................... 382/151; 382/151; 382/291; 382/296; 382/294

(58) Field of Classification Search ................. 382/151
See application file for complete search history.

(56) References Cited

U.S. PATENT DOCUMENTS

| | | | | |
|---|---|---|---|---|
| 5,754,679 A | * | 5/1998 | Koljonen et al. | ........... 382/151 |
| 6,185,343 B1 | * | 2/2001 | Ikeda et al. | ................. 382/291 |
| 6,917,699 B1 | * | 7/2005 | Sugawara | ................... 382/151 |

FOREIGN PATENT DOCUMENTS

| | | |
|---|---|---|
| JP | H2-148180 | 6/1990 |
| JP | H7-21377 | 1/1995 |
| JP | H9-102039 | 4/1997 |

* cited by examiner

*Primary Examiner*—Jingge Wu
*Assistant Examiner*—Jordan Kuhn
(74) *Attorney, Agent, or Firm*—Koda & Androlia

(57) ABSTRACT

An image processing of an object to be detected in bonding system for manufacturing, for instance, semiconductor devices including a step of calculation of a difference value between a reference image inputted beforehand and a rotated image obtained by rotating the reference image for a plurality of reference points within the reference image, a step of mask pattern production based upon the difference values for the plurality of reference points, and a step of position detection for a position of an object of detection by pattern matching by way of using an image of the object of detection obtained by imaging the object of detection, the reference image and the mask pattern.

9 Claims, 10 Drawing Sheets

IMAGE PROCESSING METHOD, AN IMAGE PROCESSING DEVICE AND A BONDING APPARATUS

BACKGROUND OF THE INVENTION

1. Field of the Invention

The present invention relates to an image processing method, an image processing device and a bonding apparatus that includes such an image processing device; and more particularly the present invention relates to a method and device that detects the position of an object of detection by way of performing pattern matching of the object of detection and a reference image.

2. Prior Art

In image processing techniques, a pattern matching is widely used. The pattern matching generally uses a portion of a reference image (constituting a known image) as a template image in order to detect the position of an object of detection by detecting the position of this known image contained in the image of the object of detection.

A position detection method that uses such pattern matching will be described below with reference to a wire bonding apparatus, which is a semiconductor assembly apparatus, as an example.

In a wire bonding apparatus, wires, typically metal wires, are bonded so that bonding pads consisting of, for instance, aluminum on the surfaces of semiconductor chips are connected to leads consisting of conductors that are formed so that the leads surround the semiconductor chips. Prior to this bonding operation, the bonding points, which are the points where bonding is performed, are calculated using pattern matching.

In pattern matching, as shown in FIG. 8, respective alignment points 32a which are reference points used for positioning are first registered. In a wire bonding apparatus of the type shown in FIG. 1 in which a camera that is fastened to an XY table via a bonding head and a camera arm is moved in the horizontal direction relative to a semiconductor chip by the operation of the XY table, such alignment points are registered in the following manner: the visual field is moved by moving the XY table 1 to which the camera 7 is fastened via the bonding head 2 and camera arm 6 while an image from the camera 7 that has imaged the semiconductor chip 14a is displayed on the display screen of a monitor 39; and the center point 32a of the cross mark 32 that indicate the center of the visual field displayed on the display screen of the monitor 39 is aligned with an arbitrary point on the semiconductor chip 14a; and then an input operation involving the pressing of the input switch of a manual input means 33, etc., is performed; and finally, a region that is surrounded by rectangular reticle mark 42 and is centered on the center point 32a is stored in a data memory 36 as a template image, and the coordinates on the XY table 1 in this case are also stored in the data memory 36 as alignment points.

Generally, in order to minimize detection error, two places are selected for the pad side (Pa1$x$, Pa1$y$), (Pa2$x$, Pa2$y$), and two places are selected for the lead side (La1$x$, La1$y$), (La2$x$, La2$y$), as the alignment points from a diagonal line in the vicinity of the corners of the semiconductor chip 14a.

Next, when the center point 32a of the cross mark 32 is aligned with appropriate positions on the individual pads P and leads L, typically with points that are located substantially in the centers of the respective pads P and leads L; and then the input switch is pressed. Thus, the coordinates of the respective bonding points are stored in the data memory 36.

In run time processing (i.e., processing during actual production of the object product), a new semiconductor device 14 that is the object of detection is set, and the XY table 1 is moved by the control of an operating device (not shown) so that the area in the vicinity of each registered alignment point A0 becomes the visual field of the camera 7 (FIG. 9). An image of the new semiconductor device 14 is acquired by the camera 7. Then, using the registered reference image, by way of pattern matching detection, when the amount of coincidence between the image of the object of detection and the reference image shows a maximum value and when such an amount of coincidence is over the specified threshold value, it is judged that a satisfactory detection is obtained; and the reference image is superimposed on the image of the object of detection at their relative positions, and the amount of positional deviation ($\Delta X$, $\Delta Y$) between the position coordinates of the center point 32a in this attitude on the XY table 1 and the position coordinates of the alignment point A0 (which is the position of the center point 32a at the time of the previous registration of the template image) on the XY table 1, e.g., (Pa1$x$, Pa1$y$), is determined. The positional deviation is determined likewise for the remaining alignment points 32a, the calculated amounts of positional deviation ($\Delta X$, $\Delta Y$) are added to the position coordinates of the alignment points measured at the time of the previous registration of the template image, e.g., as (Pa1$x$+$\Delta X$, Pa1$y$+$\Delta Y$), and the values thus obtained are designated as new alignment points Am. "Am" is a symbol, and "m" referred to here is not a numerical value that has a range.

Next, the positions of the respective pads and leads are determined by calculation from the positions of the new alignment points Am in a form that preserves the relative positions of the respective pads and leads at the time of registration with respect to the alignment points A0 (hereafter, this is referred to as "position correction"), thus determining the actual bonding points. Then, bonding operations are performed on these actual bonding points.

In cases where the semiconductor device 14 that is the object of detection is disposed in an attitude that includes a positional deviation in the direction of rotation, the portions of the image of the object of detection that do not coincide with the reference image increases. As a result, there is an increase in the number of cases in which the maximum amount of coincidence in the pattern matching detection using the reference image does not exceed the threshold value, so that detection is judged to be impossible. Ordinarily, therefore, a positional deviation of ±5° in the direction of rotation of the object of detection is considered to be the limit.

In order to expand such a maximum allowable range of the positional deviation of the object of detection in the direction of rotation, various methods have been proposed. For instance, in Japanese Patent Application Laid-Open (Kokai) No. 9-102039, a plurality of different types of rotated images obtained by rotating the reference image by various angles are prepared in advance as template images, and pattern matching is performed between these template images and an image of the object of detection. However, in such prior art methods, pattern matching at increments of several degrees in the direction of rotation must be performed for numerous points within the visual field. Thus, the quantity of calculations required is significant large, and the recognition speed is slow. Thus, such methods are impractical.

Furthermore, positional deviation of the object of detection in the direction of rotation can also cause a drop in the precision of detection. The inherent reason for this is as follows: if the image of the object of detection and the reference image are superimposed so that the amount of coincidence shows a maximum value for the pattern that serves as a reference (pad P in FIG. 9), then the position of a new alignment point Am stipulated by the position relative to the pattern that serves as a reference should coincide with the position of the original alignment point A0 similarly stipulated by the position relative to the pad P in the reference image; however, as shown in FIG. 10, in cases where the semiconductor device 14 that constitutes the object of detection is disposed in an attitude that includes a positional deviation in the direction of rotation, even if the image of the object of detection and the reference image are superimposed so that the amount of coincidence shows a maximum value with respect to the pattern that serves as a reference (the pad P in FIG. 10), the original alignment point A0 and the new alignment point Am do not coincide.

The error caused by this positional deviation of the object of detection in the direction of rotation is not a problem if the pitch between the pads P or leads L is sufficiently large. However, such error becomes a major problem when it is necessary to handle the increasingly fine pitches seen in recent years, i.e., the increasingly fine pitches between pads P or between leads L.

There are also methods in which numerous small template images in which the image region is reduced are prepared in addition to template images of the ordinary size, rough positions are assigned using these template images of the ordinary size, and then accurate positions are subsequently detected using the small template images. In such methods, however, pattern matching is performed using numerous small template images. Thus, the recognition speed is slow.

Meanwhile, various methods have also been proposed in which a mask pattern is used to mask unnecessary portions in the image of the object of detection (especially portions which are such that the precision of detection is caused to drop when the object of detection is rotated) during pattern matching (see, for instance, Japanese Patent Application Laid-Open (Kokai) Nos. 7-21377 and 2-148180). However, the preparation of this mask pattern is performed by hand, and thus there is a demand for some means that make this process work more efficiently. In this regard, there is a method that automatically produces a mask pattern with a fixed width so that the edge portions of the pattern that serves as a reference in the image of the object of detection are covered. However, this method has drawbacks. The detection precision decreases when no positional deviation is involved in the direction of rotation.

SUMMARY OF THE INVENTION

Accordingly, the object of the present invention is to provide an image processing system that realizes high-precision position detection of the object of detection without performing pattern matching in the direction of rotation of such an object (which tends to require an excessive amount of calculation) even in cases where the object of detection is disposed in an attitude that includes a positional deviation in its direction of rotation.

It is still another object of the present invention to provide an image processing system that produces a mask pattern in an efficient manner without lowering the precision of detection.

The above objects are accomplished by a unique structure for an image processing method that comprises:

a difference value calculation process for calculating a difference value between a reference image inputted beforehand and a rotated image obtained by rotating the reference image, in which the difference value is calculated for each one a plurality of reference points within the reference image;

a mask pattern production process for producing a mask pattern based upon the difference values for the plurality of reference points; and a position detection process for detecting a position of an object of detection by pattern matching using an image of the object of detection obtained by imaging the object of detection, the reference image and the mask pattern.

In the present application, difference values between the rotated image and the reference image are calculated beforehand, and a mask pattern is produced on the basis of these difference values. Furthermore, the position of the object of detection is detected by pattern matching using the image of the object of detection, the reference image and the mask pattern in the run time. Accordingly, even in cases where the object of imaging is disposed in an attitude that includes a positional deviation in the direction of rotation, a high-precision position detection is realized without performing pattern matching in the direction of rotation (which tends to require an excessive amount of calculation) by excluding the portions of the mask pattern that are susceptible to the effects of rotation from the object of pattern matching, or by giving a low weight to the evaluation values for these portions.

Furthermore, in the present invention, since the mask pattern image is produced on the basis of difference values between the rotated image and the reference image, the regions of the mask pattern image can be limited to the portions arising from the rotation of the object of detection. As a result, the drop in the precision of detection that occurs when the object of detection includes no positional deviation in the direction of rotation can be limited compared to cases where a mask pattern of a fixed width is used.

Furthermore, in the image processing method of the present invention, the difference value calculation process is performed at relative positions of the rotated image and the reference image that are located within a specified range from relative positions of two images at which an amount of coincidence between the two images shows a maximum value.

In the above method of the present application, the difference value calculation process is performed within a specified range from relative positions of the rotated image and the reference image at which the amount of coincidence of such two images shows a maximum value. Accordingly, the effects of rotation of the object of detection on the pattern matching can be favorably extracted.

In addition, in the image processing method of the present invention, the difference value calculation process is performed for a plurality of different angles of rotation, and the mask pattern production process includes a maximum-value image production step for producing a maximum-value image that contains absolute values of difference values that are within a specified range from a maximum value among the absolute values of the difference values for the reference points calculated for the plurality of angles of rotation as evaluation values for the reference points.

In this method, the difference value calculation process is performed for a plurality of different angles of rotation. Furthermore, in the mask pattern production process, a maximum-vale image is produced which contains the absolute values of difference values that are within a specified range from the maximum value among the absolute values of the difference values for the reference points calculated for the plurality of angles of rotation as evaluation values for these reference points. Accordingly, if the difference value is large at some angle of rotation for a given position, this position can be included in the mask pattern. Consequently, it is possible to produce a common mask pattern that reflects difference values across a plurality of angles of rotation; and the position detection process can be simplified and the working efficiency can be improved.

Furthermore, in the image processing method of the present invention, the mask pattern production process may further includes:
- a comparison step that compares respective evaluation values in the maximum-value image with a specified threshold value, and
- a selection step that selects reference points that exceed the threshold value.

In this method, a mask pattern is produced by comparing the respective evaluation values in the maximum-value image with a specified threshold value and by selecting reference points that exceed this threshold valve. Thus, a mask pattern can be obtained easily.

In the image processing method according to the present invention, the position detection process includes an exclusion processing step that excludes regions which correspond to the mask pattern in the image of the object of detection from an object of the pattern matching.

Thus, the regions that correspond to the mask pattern in the image of the object of detection are excluded from the object of pattern matching in the position detection process. Accordingly, the calculations that use the mask pattern can be performed in a simple manner.

The above-described objects are further accomplished by a unique structure for an image processing device that comprises:
- a difference value calculation means that calculates a difference value between a reference image inputted beforehand and a rotated image obtained by rotating the reference image for a plurality of reference points within the reference image, in which the difference value is calculated for each one a plurality of reference points within the reference image,
- a mask pattern production means that produces a mask pattern based upon the difference values for the plurality of reference points, and
- a position detection means that detects a position of an object of detection by pattern matching by way of using an image of the object of detection obtained by imaging the object of detection, the reference image and the mask pattern.

In addition, the above-described objects are accomplished by a unique structure for a bonding apparatus of the present invention that includes an image processing device that is comprised of:
- a difference value calculation means that calculates a difference value between a reference image inputted beforehand and a rotated image obtained by rotating the reference image for a plurality of reference points within the reference image, in which the difference value is calculated for each one a plurality of reference points within the reference image,
- a mask pattern production means that produces a mask pattern based upon the difference values for the plurality of reference points, and
- a position detection means that detects a position of an object of detection by pattern matching by way of using an image of the object of detection obtained by imaging the object of detection, the reference image and the mask pattern.

DETAILED DESCRIPTION OF THE INVENTION

The present invention will be described in detail by way of the embodiments with reference to the accompanying drawings.

Figure 1:
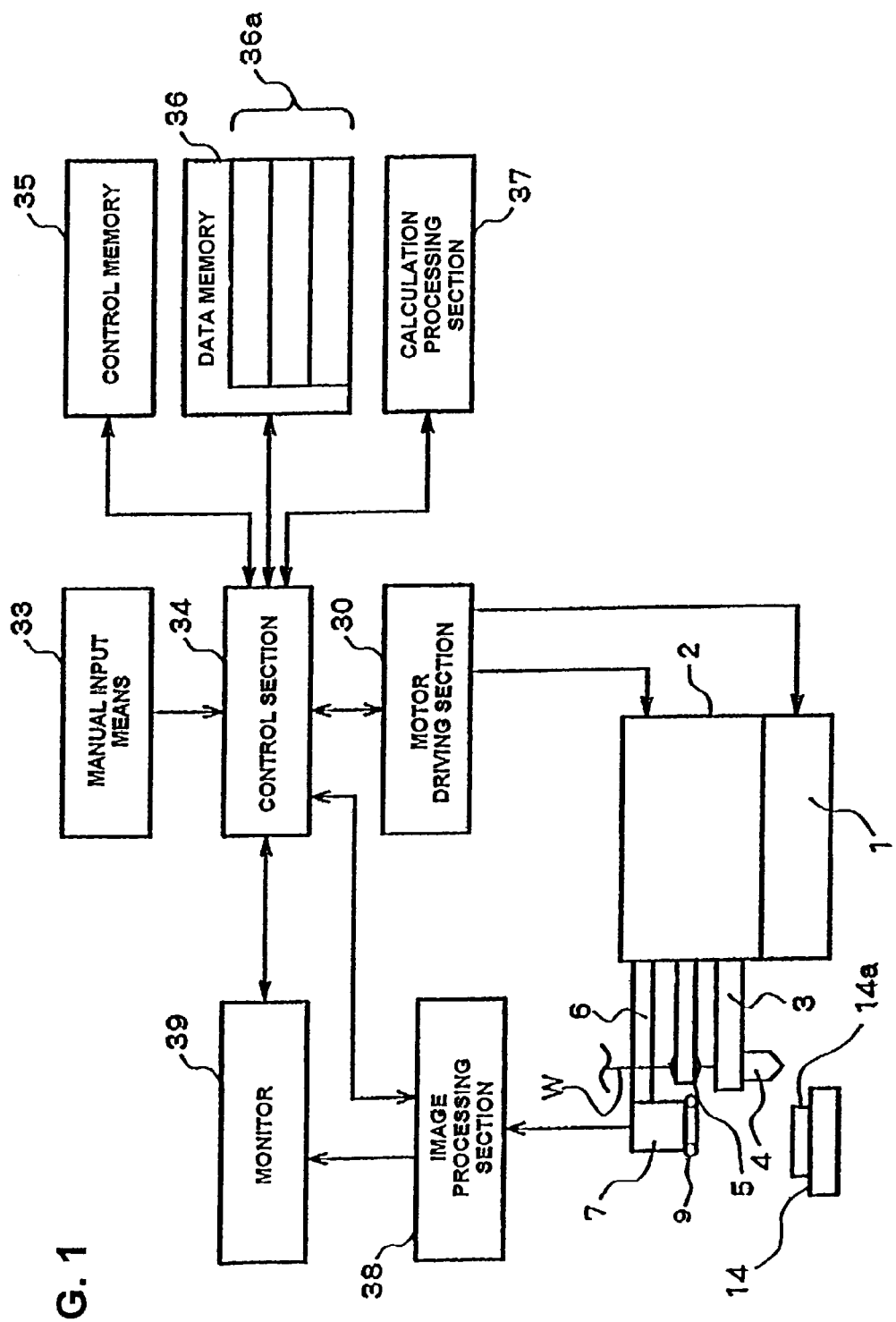
FIG. 1 is a block diagram that shows the structure of a bonding apparatus according to one embodiment of the present invention.

In FIG. 1, that shows a wire bonder according to one embodiment of the present invention, a bonding arm 3 is disposed on a bonding head 2 that is mounted on an XY table 1, and a tool 4 is attached to the tip end portion of the bonding arm 3. The bonding arm 3 is driven in the vertical direction by a Z-axis motor (not shown). A damper 5 that holds a wire W is disposed above the bonding arm 3. The lower portion of the wire W is passed through the tool 4. The tool 4 in this embodiment is a capillary.

A camera arm 6 is attached to the bonding head 2, and a camera 7 is fastened to the camera arm 6. The camera 7 takes the images of a semiconductor device 14 on which a semiconductor chip 14a and other elements are mounted. The XY table 1 is accurately moved in the X direction and Y direction, which are mutually perpendicular coordinate axis directions in the horizontal plane, by means of XY table motors (not shown) consisting of two pulse motors, etc., installed in the vicinity of the XY table 1. The structure described so far is known in prior art.

The XY table 1 is driven, via a motor driving section 30 and the XY table motors, by way of the commands from a control section 34 that is, for instance, a microprocessor. The images taken by the camera 7 are converted into image data that consist of an electrical signal. This image data is processed by an image processing section 38 and inputted into a calculation processing section 37 via the control section 34. Various calculations including calculations involved in position detection (described later) are performed in the calculation processing section 37, and programs and data used for such calculations are temporarily held in a control memory 35. A manual input means 33 and a monitor 39 are connected to the control section 34. The manual input means 33 is preferably at least a pointing device such as a mouse input device (merely called a "mouse"), etc., equipped with a direction-indicating function in the X and Y directions and a setting signal input function based on an input button. The manual input means 33 can be a known keyboard equipped with a character input function.

Figure 4:
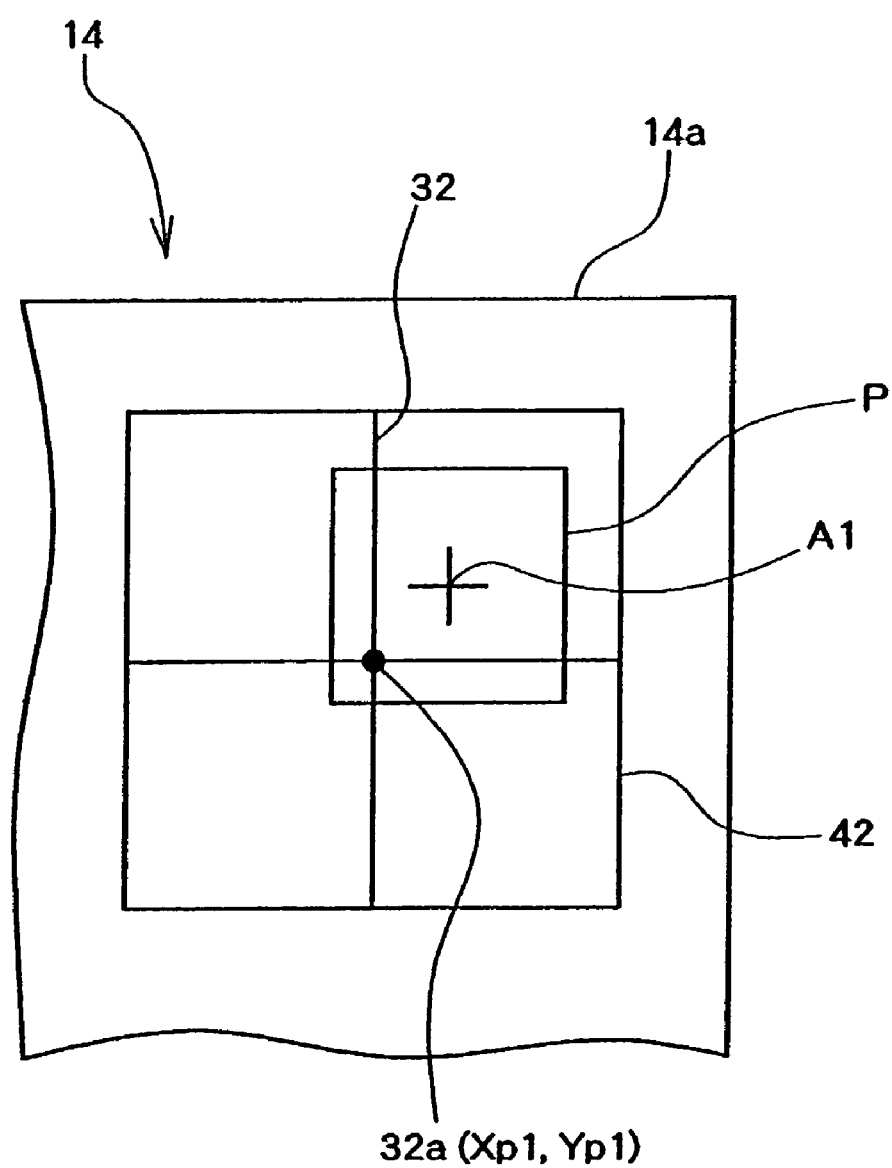
FIG. 4 is an explanatory diagram that shows the reference image.

The monitor 39 is, for instance, a CRT (cathode ray tube) or a liquid crystal display device. Images acquired by the camera 7, associated coordinate values, numerical values such as magnifications, etc. and various types of character messages (described later), etc. are displayed on the display screen of the monitor 39 based upon the output of the control section 34. In the position detection process, as shown in FIG. 4, cross marks 32 and a rectangular reticle mark 42 are shown on the display screen. The cross marks 32 indicate the center of the visual field, and the rectangular reticle mark 42 is displayed and stored in memory as a mark that indicates a region within the visual field that surrounds the cross marks 32. The intersection point of the vertical line and horizontal line in the cross marks 32 is the center point 32*a*.

The data memory 36 is a known random-access memory, a hard disk drive, etc. that allows the reading and writing of data. A data library 36*a* is accommodated in the storage region of the data memory 36. Template images (described later), past values such as detected position coordinates, etc., default values which are the initial states of these values, and various types of setting values used in other operations of the image processing device, are stored in this data library 36*a*. Various types of data are stored (as will be described later) by signals from the control section 34.

Figure 2:
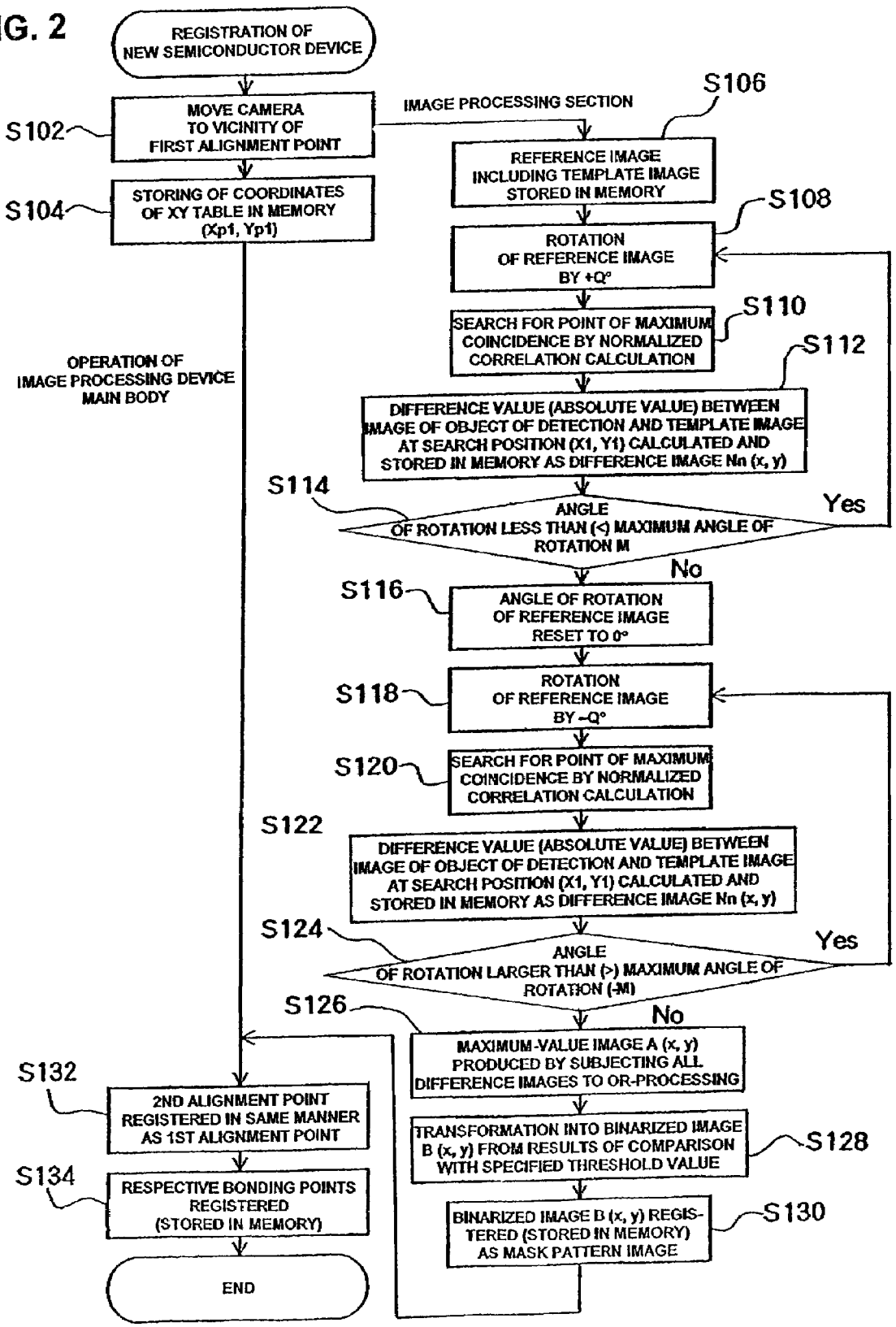
FIG. 2 is a flow chart that shows one example of the registration processing of a new semiconductor device.

In the shown embodiment, the registration of alignment points and respective bonding points, and the storage in memory of the correction amount, are first performed as registration processing for a new semiconductor device 14. Then, the position detection by pattern matching is performed as processing in the run time FIG. 2 is a flow chart that shows the registration processing for a new semiconductor device 14.

First, the XY table 1 is driven in accordance with the output of the control section 34, so that the camera 7 is moved to the vicinity of the point that is to be the 1st alignment point (S102). After this movement, the image acquired by the camera 7 is as shown in FIG. 4.

Next, the position coordinates (Xp1, Yp1) of the center point 32*a* of the cross marks 32 in the moved attitude are stored in the data memory 36 in accordance with the output of the control section 34 (S104). In the shown embodiment, a point that coincides with the center point 32*a* which is the center point of a visual field that contains pad P is used as the 1 st alignment point A1. However, it is possible to use the center point of the pad P as the alignment point.

Figure 5:
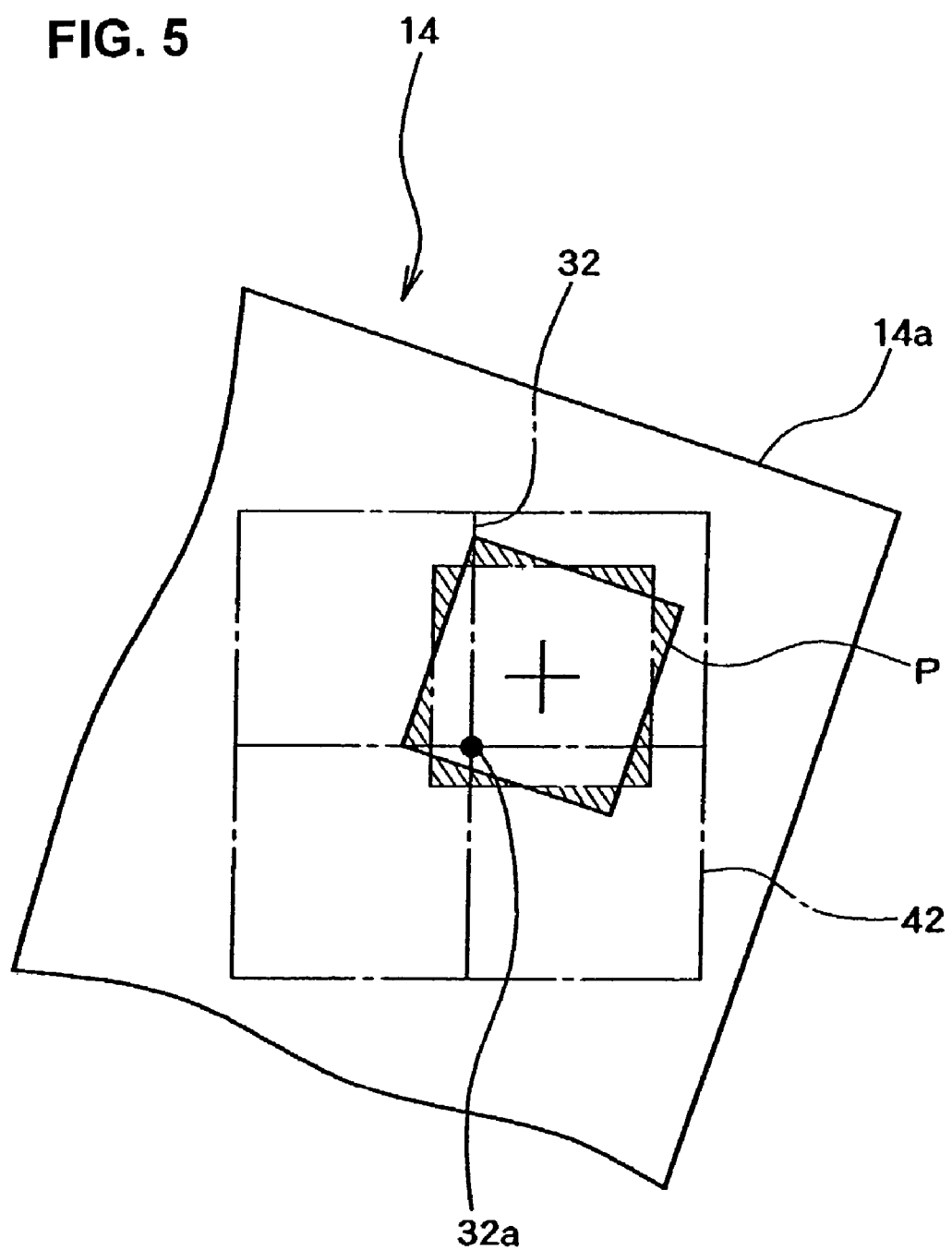
FIG. 5 is an explanatory diagram that shows the process of pattern matching for the rotated image (rotated in the forward direction)
Figure 6:
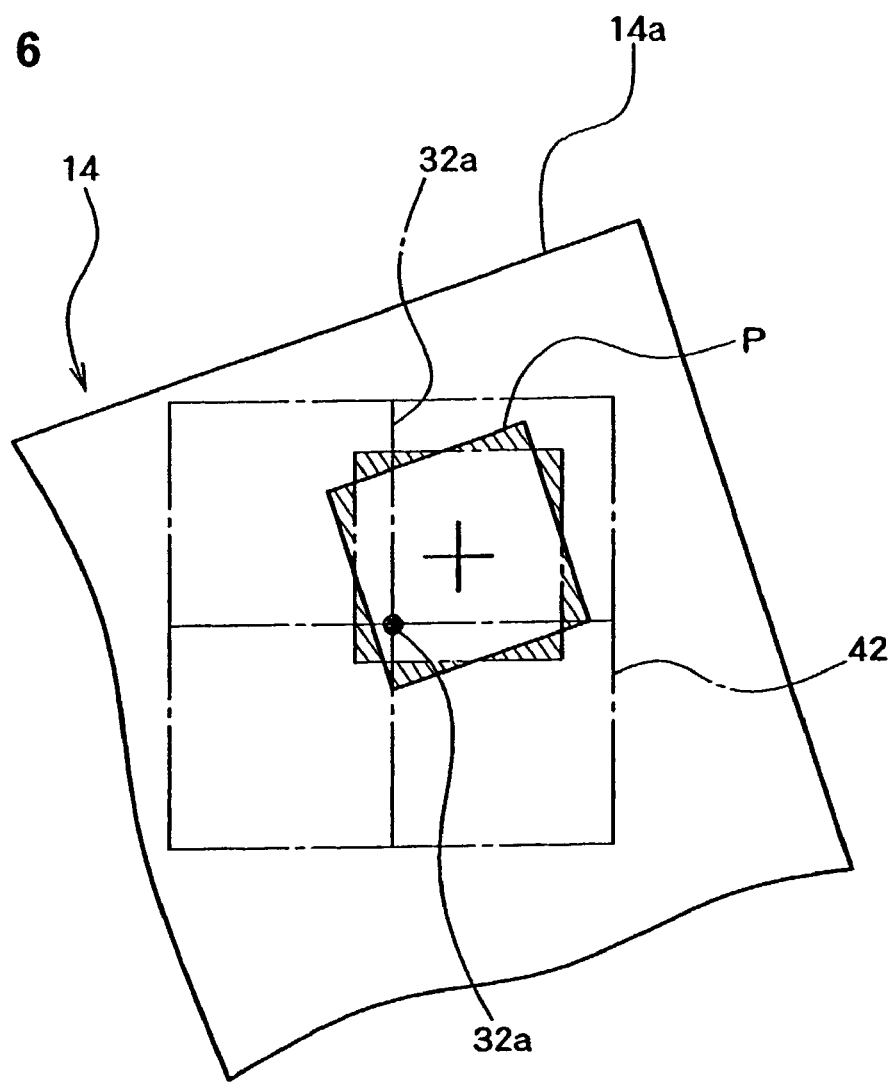
FIG. 6 is an explanatory diagram that shows the process of pattern matching for the rotated image (rotated in the reverse direction)

The semiconductor device 14 is imaged by the camera 7 in this position; and the image data obtained by conversion into an electrical signal is processed by the image processing section 38 and stored in the data library 36*a* of the data memory 36 as a reference image (S106). Within this reference image, the region surrounded by the reticle mark 42 is used as a template image in the position detection process (described later). The image indicated by solid lines in FIG. 4, and the upright images indicated by dotted lines in FIGS. 5 and 6, are the "reference image". In the shown embodiment, for the sake of easier understanding, the images obtained by way of imaging the upright semiconductor device 14 are used as the reference images and template images. However, the semiconductor device 14 in the reference images and template images can take any postures.

Figure 7:
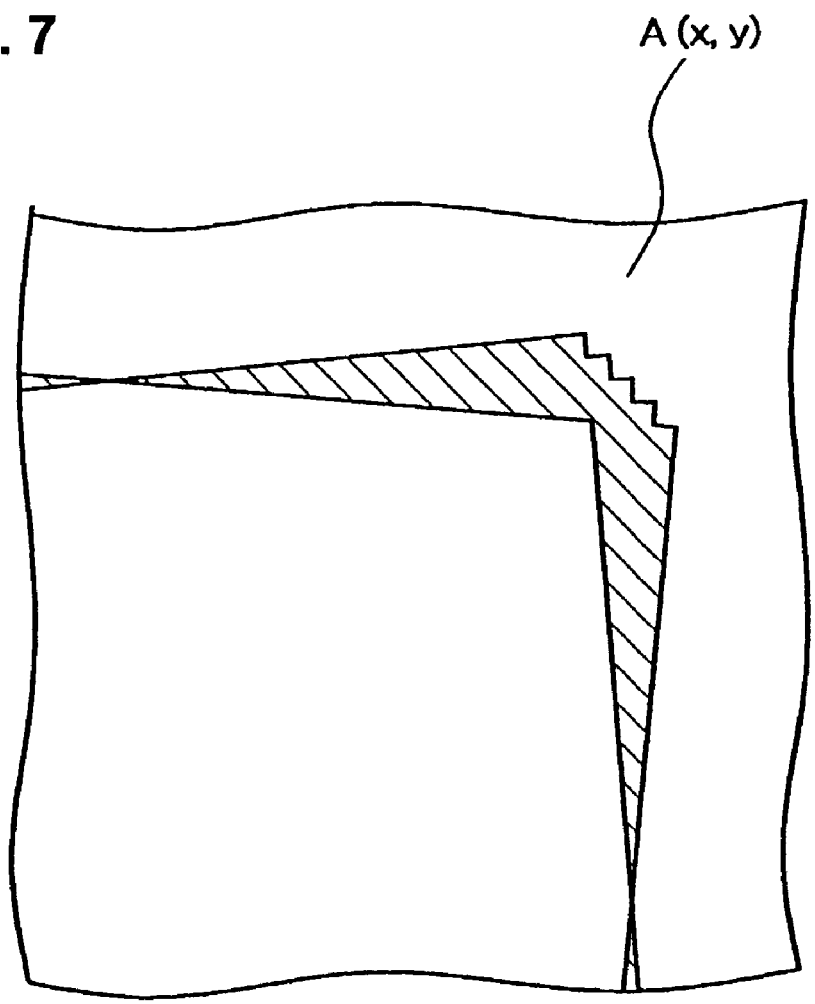
FIG. 7 is an enlarged view of the essential portion that shows the maximum-value image.
Figure 8:
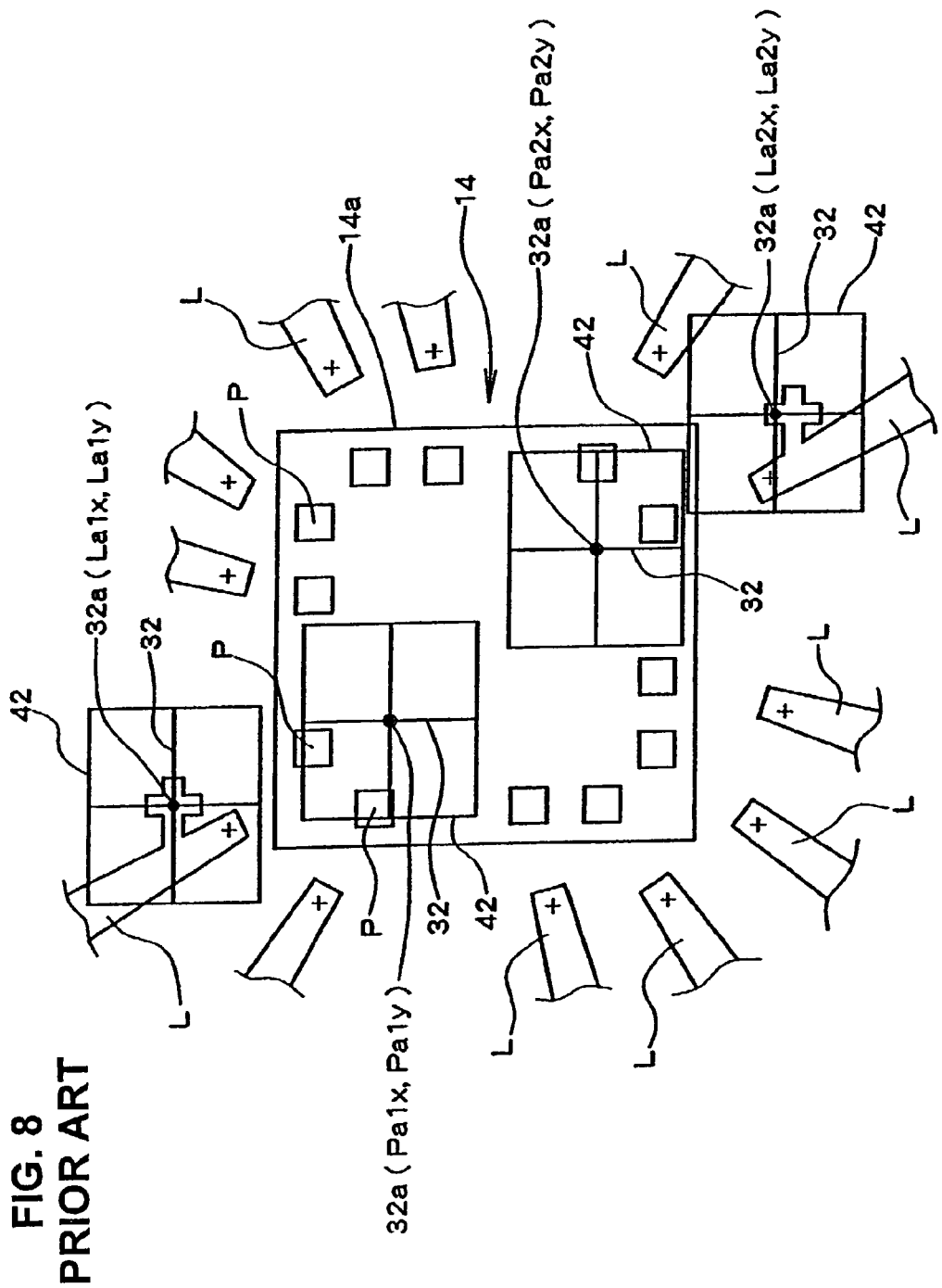
FIG. 8 is an explanatory diagram that shows a conventional alignment point setting process.
Figure 9:
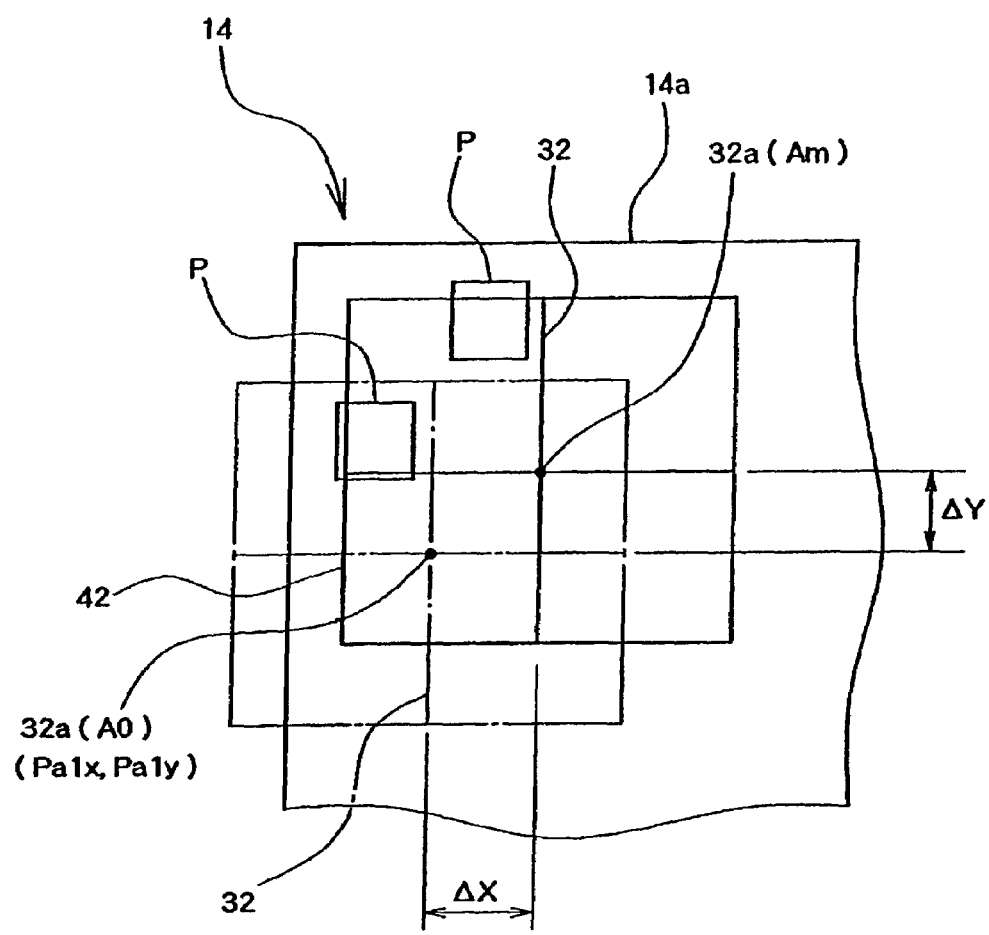
FIG. 9 is an explanatory diagram that shows the process of pattern matching of the image of the object of detection and the reference image in a conventional method.
Figure 10:
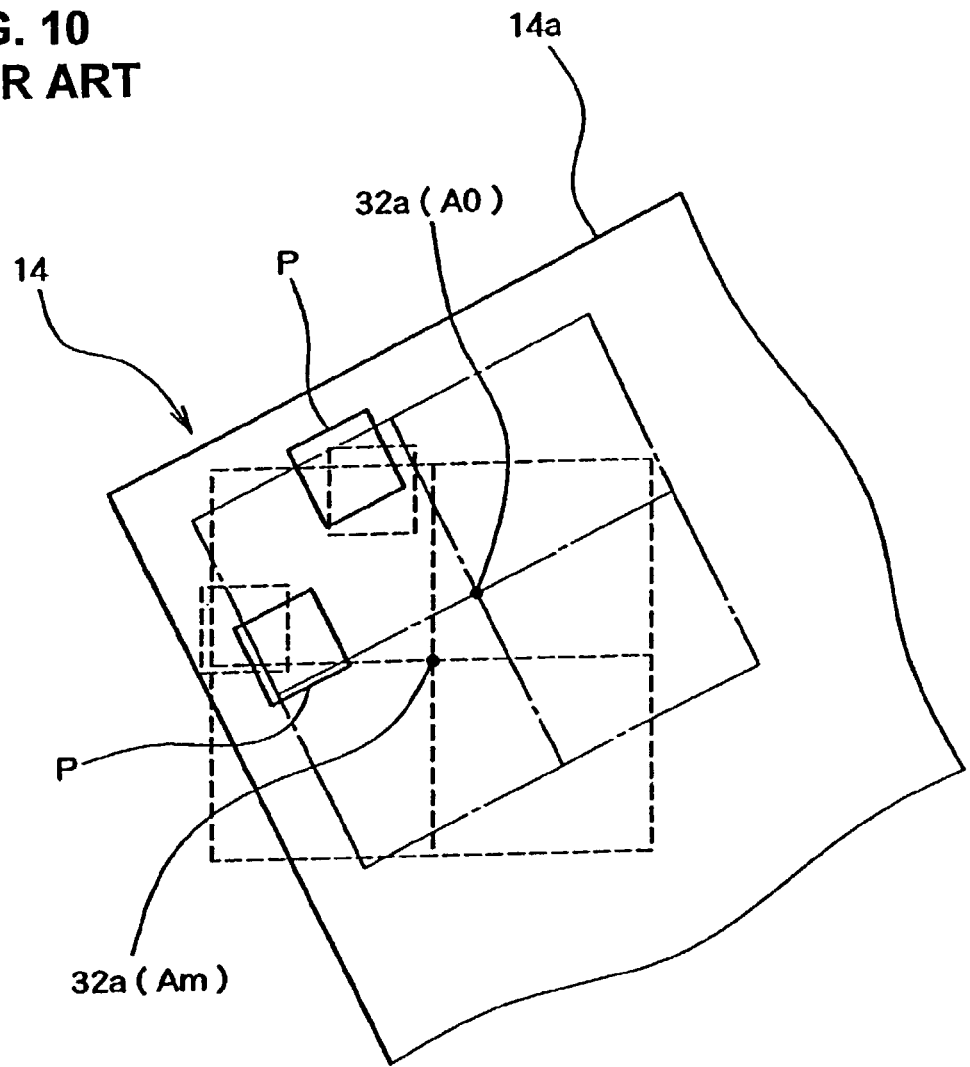
FIG. 10 is an explanatory diagram that shows the causes of position detection errors in the conventional method.

Next, in the calculation processing section 37, processing that rotates the reference image by +Q° (degrees) is performed (S108). This rotation is performed about any arbitrary center point, for instance, a point that is at an upper left corner (not shown) of the reference image. The image obtained as a result of such rotation processing will be referred to below as the "rotated image". In FIGS. 5 and 6, and in FIGS. 7 and 8 that will be described later, the images in an inclined attitude shown by solid lines are the reference image.

Next, as pattern matching processing of the rotated image and reference image, the point of maximum coincidence with the reference image in the rotated image is sought by way of using a normalized correlation calculation (S110). More specifically, the correlation value R between the rotated image and reference image that is calculated in the following Numerical Expression 1 is calculated for each pixel within the region of the rotated image or for the respective reference points that are disposed in a discrete manner with the region of the rotated image; then, the point at which the correlation value R shows the maximum value is determined as a point of maximum coincidence.

$$R = \frac{\{N\Sigma IM - \{\Sigma I\Sigma M\}\}}{\sqrt{\{N\Sigma I^2 - \{\Sigma I\}^2\}}\sqrt{\{N\Sigma M^2 - \{\Sigma M\}^2\}}}$$ Numerical Expression 1

Range of $R$: $-1 \leq R \leq 1$

In this formula, R is the correlation value, N is the number of pixels within the rotated image, I is the brightness value at respective positions within the rotated image, and M is the brightness value of the rotated image.

Then, the difference value (absolute value) between the image of the object of detection and the template image is calculated for the coordinates (X1, Y1) of the point of maximum coincidence obtained as described above, and this value is stored in the data memory 36 as the difference image N1 (x, y). In concrete terms, an inter-image subtraction is performed between the image of the object of detection and the template image, and absolute value processing (i.e., processing which reverses the sign in cases where the result of the inter-image subtraction is negative) is performed on the result of the inter-image subtraction. Then, a set of difference images N1 (x, y) which map the absolute values of the difference values onto the respective coordinates are prepared. The regions indicated by hatching lines in FIG. 5 have values in the difference images N1 (x, y) for these positions (X1, Y1).

Next, a judgment is made as to whether or not the current angle of rotation is within the predetermined range of the maximum angle of rotation M (S114). When the judgment is affirmative, then the processing of steps S108 through S112 is repeated; and difference images Nn (x, y) are stored in the data memory 36 for, for instance, each of the angles of rotation 0, +Q and +2Q.

In cases where the current angle of rotation has reached the maximum angle of rotation M, the angle of rotation is next reset to 0° (S116); and similar processing is performed while rotating the reference image −Q° at a time (FIG. 6) in steps S118 through S124. Thus, for example, difference images Nn (x, y) are stored in the data memory 36 for each of the angles of rotation −Q and −2Q. In cases where the current angle of rotation is less than the predetermined maximum angle of rotation −M, then the processing shifts to step S126.

In step S126, maximum-value images A (x, y) are produced by OR-processing of all of the acquired difference images for the respective coordinates. More specifically, in the difference images Nn (x, y) calculated for the angles of rotation −2Q through +2Q, the maximum values among the difference values for the respective coordinates are selected, and a new set of maximum-value image A (x, y) in which these maximum values are collected for all of the coordinates is produced. The regions indicated by hatching lines in FIG. 7 have values in the maximum-value image A (x, y) for the position (X1, Y1).

Next, for the maximum-value image A (x, y) thus produced, binarization processing (in other words, processing that converts the values for points that exceed a threshold value into "1", and that converts the values for points that are below the threshold value into "0") is performed using a specified threshold value. As a result, the maximum-value image A (x, y) is transformed into binarized image B (x, y) (S128).

The binarized image thus obtained is used as mask pattern image and is stored in the data memory 36 (S130).

Next, binarized image is produced for the 2nd alignment point A2 (not shown) in the same manner as in the processing performed for the 1st alignment point A1 (S102 through S13), and this image is stored in the data memory 36 as mask pattern image (S132).

Next, a registration of the coordinates of the respective bonding points is performed (S134). The registration of the coordinates of these respective bonding points is accomplished by moving the visual field to appropriate positions for the individual pads P and leads L (other than the pads P selected as the 1st alignment point A1 and 2nd alignment point A2), typically to such points that are located substantially at the center of each pad P and lead L, so that the center point 32a of the cross marks 32 are aligned with these points, and then by pressing the input switch of the manual input means 33, etc., thus storing the coordinates of the respective bonding points in the data memory 36. Instead of using the above-described manual input method, it is also possible to determine points located substantially at the center of each pad P and lead L by image processing and to store these coordinate values in the data memory 36. The processing described above is performed so as to register a new semiconductor device 14.

Figure 3:
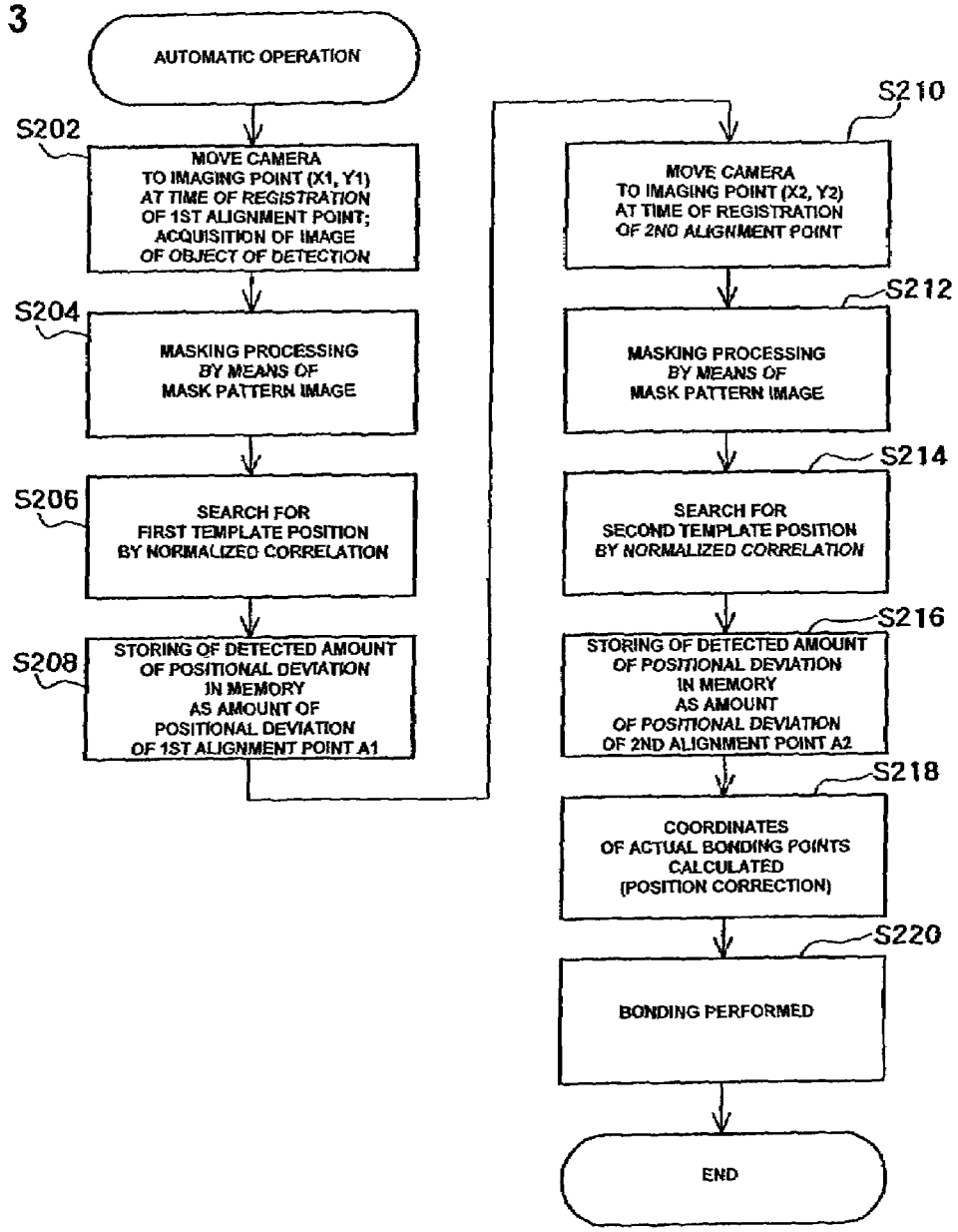
FIG. 3 is a flow chart that shows one example of the run time processing.

The run time processing is performed as shown in FIG. 3.

First, a new semiconductor device 14, that is the object of detection, is disposed; and the XY table is actuated by the output from the control section 34, thus moving the camera 7 so that the center point of the visual field of the camera 7 coincides with the position (X1, Y1) of the imaging point at the time of registration of the 1st alignment point (S202). Then, the image of the object of detection is obtained by imaging the semiconductor device 14 (the object of detection) by the camera 7 from this position.

Next, masking processing is performed on the template image as exclusion processing that excludes regions from the image of the object of detection, such regions corresponding to the mask pattern (S204). In concrete terms, the masking process is performed by making the data of regions that have a value of "1" in the binarized images invalid with respect to the template image of the 1st alignment point A1.

Next, the point of maximum coincidence with the template image in the object of detection is sought utilizing a normalized correlation calculation as pattern matching processing between the image of the object of detection and the template image that is been subjected to masking processing (S206). This calculation is performed using a normalized correlation equation similar to that of the above-described Numerical Expression 1; and correlation values R between the image of the object of detection and the template image are calculated for each pixel in the region of the image of the object of detection or for each discretely disposed reference point within the region of the image of the object of detection. Then, the point where the correlation value R shows a maximum value is sought.

Thereafter, the template image is superimposed on the image of the object of detection at the point of maximum coincidence thus determined, i.e., in the relative position at which the amount of coincidence between the image of the object of detection and the reference image shows a maximum value. The amount of positional deviation between the position coordinates of the center point 32a of the cross marks 32 in this attitude and the coordinates (X1, Y1) of the imaging point that was the position of the center point of the cross marks 32 when the reference image was previously registered is determined. This amount is stored in the data memory 36 (S208).

Then, processing similar to that performed for the 1st alignment point A1 in steps S202 through S208 is performed for the 2nd alignment point A2 (S212 through S216); and the amount of positional deviation thus obtained is stored in the data memory 36 as the amount of positional deviation of the alignment point A2 on the new semiconductor device 14 relative to the alignment point on the semiconductor chip 14a at the time of imaging.

Next, based upon the coordinates of the respective bonding points previously registered in step S126, the positions of the respective pads P and leads L are determined (position correction) by calculation from the 1st alignment point A1 and 2nd alignment point A2 on the new semiconductor device 14 in a form in which the positions relative to the 1st alignment point and 2nd alignment point A2 are preserved, so that the actual bonding points are determined (S218).

Then, bonding operations are performed on these actual bonding points (S220). In concrete terms, the XY table 1 is driven by the output from the control section 34 so that the tool 4 is moved to the respective actual bonding points, and bonding is performed on these bonding points.

Thus, in the above embodiment, difference values between the rotated image and the reference image are calculated beforehand (S112, S122), and a mask pattern image is produced on the basis of these difference values (S130). Then, in the run time, the position of the object of detection is detected by pattern matching using the image of the object of detection, the reference image and the mask pattern image (S206, S214). Accordingly, even in cases where the object of detection is disposed in an attitude that includes positional deviation in the direction of rotation, the portions of the mask pattern image that are susceptible to the effects of rotation are excluded from the object of pattern matching, and a high-precision position detection can be accomplished without performing pattern matching in the direction of rotation, which tends to require an excessive amount of calculation.

Furthermore, since the drop of the correlation value used as the amount of coincidence can be inhibited as a result of the use of a mask pattern image, the frequency with which detection becomes impossible as a result of a drop of the correlation value below a specified threshold value can be reduced, so that the limit on the positional deviation of the object of detection in the direction of rotation can be expanded beyond the conventional ±5° region.

In the above embodiment, the mask pattern image is produced on the basis of difference values between the rotated image and the reference image. Accordingly, the regions of the mask pattern image can be limited to the portions arising from the rotation of the object of detection. As a result, the detection precision drop that occurs in cases where the object of detection includes no positional deviation in the direction of rotation can be limited compared to cases where a mask pattern of a fixed width is used.

Furthermore, since the calculation of the difference values (S112, S122) is performed in relative positions where the amount of coincidence between the rotated image and the reference images shows a maximum value (S110, S120), the effects of the rotation of the object of detection on the pattern matching can be extracted in a favorable manner.

In addition, in the above embodiment, the calculation of difference values in steps S112 and S122 is performed for a plurality of different angles of rotation (S108, S114, S118 and S124); and in the production of the mask pattern, a maximum-value image A (x, y), which includes the maximum values among the absolute values of the difference values for the reference points calculated for the plurality of angles of rotation as evaluation values for these reference points, is created (S126). Accordingly, if the difference value is large at some angle of rotation for a given position, this position can be included in the mask pattern. Consequently, a common mask pattern that reflects difference values over a plurality of angles of rotation can be produced, so that the position detection process can be simplified, and the working efficiency improves.

Furthermore, the mask pattern image is produced by comparing the respective difference values in the maximum-value image A (x, y) with a specified threshold value and by selecting the values that exceed this threshold value (S128). Accordingly, the mask pattern image can be obtained easily.

In the present embodiment, regions that correspond to the mask pattern image in the image of the object of detection are excluded from the object of pattern matching by performing masking processing on the template image (S204, S212). Accordingly, the calculations that use the mask pattern can be performed in a simple manner.

Furthermore, regions that correspond to the mask pattern image are excluded form the object of pattern matching. Instead, it is also possible to use a structure in which the regions that correspond to the mask pattern image are given a lower weight (or importance) in accordance with the size of the difference values or the size of the maximum values in the calculation of the amounts of coincidence (that corresponds to the correlation values in the shown embodiment). For example, for each pixel that corresponds to the mask pattern image, the correlation values can be given a smaller weight (importance) in stages or in a continuous manner by way of subtracting values that correspond to the difference values (absolute values) from the correlation values at the time of pattern matching or by way of dividing the correlation values by values that correspond to the difference values (absolute values).

Furthermore, in the shown embodiment, the calculation of the difference values (S112, S122) is performed in relative positions where the amount of coincidence between the rotated image and the reference images shows a maximum value (S110, S120). Instead, it is also possible in the present invention to use a structure in which the calculation of the difference values is performed in relative positions that are located within a specified range from the relative positions where the amount of coincidence between the rotated image and the reference image shows a maximum value.

Furthermore, a maximum-value image A (x, y) is produced (S126) which contains the maximum values among the absolute values of the difference values calculated for a plurality of angles of rotation as evaluation values for the reference points (position coordinates) in question. Instead, it is also possible in the present invention to employ values that are within a specified range from the maximum values of the absolute values of the difference values and to produce a mask pattern image in this way.

Furthermore, the correlation values are used, in the shown embodiment, as indices for evaluating the amount of coincidence between the reference image and the rotated image or for evaluating the amount of coincidence between the reference image and an inputted image. However, such is a mere example. In regard to the amount of coincidence treated in the present invention, various other universally known methods for evaluating the degree of coincidence can be employed. For example, a method that uses residual differences can be employed. Furthermore, in cases where the amount of coincidence between binary images is evaluated, the count value obtained by a method in which pixels whose values coincide are counted as 1 (one) and pixels whose values do not coincide are counted as 0 (zero) can be used as the amount of coincidence.

In addition, in the embodiments described above, the alignment points are calculated with reference to a pad P. However, it is not essential that the alignment points be determined utilizing a pad P. It is also possible to utilize some other pattern, especially the shape of a portion of the semiconductor chip 14a, a unique arrangement of a plurality of patterns, or a combination of these, as long as the pattern used has a detectable unique shape appearing in the semiconductor device 14. Furthermore, in the respective embodiments described above, the description is made mainly for a process in which the bonding points on the pads P are calculated; however, a similar process can be performed in the calculation of bonding points on the leads L or on other members. Also, in the respective embodiments described above, the number of alignment points is set at two. However, the present invention can also be applied to a system that uses three or more alignment points.

The present invention is described with reference to a wire bonding apparatus. However, the present invention is widely used for position detection in other types of semiconductor manufacturing apparatuses and in other apparatuses that use pattern matching, and such structures are in the scope of the present invention.

The invention claimed is:

1. An image processing method comprising:
   a step of performing a difference value calculation between a reference image inputted beforehand and a rotated image obtained by rotating said reference image, said difference value calculation being executed for each one of a plurality of reference points within said reference image,
   a step of performing a mask pattern production based upon difference values for said plurality of reference points, and then
   a step of performing a position detection of an object of detection by pattern matching using an image of said object of detection obtained by imaging said object of detection, said reference image and said mask pattern.

2. The image processing method according to claim 1, wherein said step of performing a difference value calculation is performed at relative positions of said rotated image and said reference image that are located within a specified range from relative positions of two images at which an amount of coincidence between said two images shows a maximum value.

3. The image processing method according to claim 1 or 2, wherein
said step of performing a difference value calculation is performed for a plurality of different angles of rotation; and
said step of performing a mask pattern production includes a maximum-value image production step that produces a maximum-value image that contains absolute values of difference values that are within a specified range from a maximum value among said absolute values of said difference values for said reference points calculated for said plurality of angles of rotation as evaluation values for said reference points.

4. The image processing method according to claim 3, wherein said step of performing a mask pattern production further includes:
a comparison step that compares respective evaluation values in said maximum-value image with a specified threshold value, and
a selection step that selects reference points that exceed said threshold value.

5. The image processing method according to claim 1 or 2, wherein said step of performing a position detection includes an exclusion step that excludes regions which correspond to said mask pattern in said image of said object of detection from an object of said pattern matching.

6. The image processing method according to claim 3, wherein said step of performing a position detection includes an exclusion step that excludes regions which correspond to said mask pattern in said image of said object of detection from an object of said pattern matching.

7. The image processing method according to claim 4, wherein said step of performing a position detection includes an exclusion step that excludes regions which correspond to said mask pattern in said image of said object of detection from an object of said pattern matching.

8. An image processing device comprising:
a difference value calculation means that calculates a difference value between a reference image inputted beforehand and a rotated image obtained by rotating said reference image, said difference value being calculated for each one of a plurality of reference points within said reference image,
a mask pattern production means that produces a mask pattern based upon said difference values for said plurality of reference points, and
a position detection means that detects a position of an object of detection by pattern matching using an image of said object of detection obtained by imaging said object of detection, said reference image and said mask pattern.

9. A bonding apparatus provided with an image processing device, wherein said image processing device is comprised of:
a difference value calculation means that calculates a difference value between a reference image inputted beforehand and a rotated image obtained by rotating said reference image for a plurality of reference points within said reference image, said difference value being calculated for each one of a plurality of reference points within said reference image,
a mask pattern production means that produces a mask pattern based upon said difference values for said plurality of reference points, and
a position detection means that detects a position of an object of detection by pattern matching using an image of said object of detection obtained by imaging said object of detection, said reference image and said mask pattern.

* * * * *